United States Patent [19]
Yamada et al.

[11] Patent Number: 5,652,579
[45] Date of Patent: Jul. 29, 1997

[54] KNOWLEDGE-BASED ACCESS SYSTEM FOR CONTROL FUNCTIONS

[75] Inventors: Fumiya Yamada, Aichi; Satoshi Ishiguro, Kanagawa, both of Japan

[73] Assignee: Sony Corporation, Tokyo, Japan

[21] Appl. No.: 698,466

[22] Filed: Aug. 15, 1996

Related U.S. Application Data

[63] Continuation of Ser. No. 400,452, Mar. 7, 1995, abandoned, which is a continuation of Ser. No. 993,835, Dec. 21, 1992, abandoned.

[30] Foreign Application Priority Data

Dec. 27, 1991 [JP] Japan .................................. 3-359358

[51] Int. Cl.$^6$ .................................................. H03K 17/94
[52] U.S. Cl. .......................... 341/23; 341/176; 340/825.3
[58] Field of Search ................... 341/22, 23, 26, 341/176; 348/734; 340/825.22, 825.24, 825.25, 825.3, 825.31, 825.32, 825.33, 825.34

[56] References Cited

U.S. PATENT DOCUMENTS

| 4,827,440 | 5/1989 | Wathor | 341/23 |
| 5,097,260 | 3/1992 | Ahn | 348/734 X |
| 5,241,583 | 8/1993 | Martensson | 379/58 |

*Primary Examiner*—Jeffery Hofsass
*Assistant Examiner*—Andrew Hill
*Attorney, Agent, or Firm*—William S. Frommer; Alvin Sinderbrand

[57] ABSTRACT

An electronic apparatus having two or more functions includes a nonvolatile store in which the identities of two or more keys are stored and two or more functions are classified into groups, each group being distinguished by two or more of the keys. A controller is coupled with the nonvolatile store and enables a function that is selected by operating a key, which function matches an identification number to be entered by a user.

7 Claims, 3 Drawing Sheets

KNOWLEDGE-BASED ACCESS SYSTEM FOR CONTROL FUNCTIONS

This application is a continuation of application Ser. No. 08/400,452, filed Mar. 7, 1995, abandoned which is a continuation of application Ser. No. 07/993,835 filed Dec. 21, 1992 abandoned.

BACKGROUND OF THE INVENTION

1. Field of the Invention

This invention relates to an electronic apparatus and, more particularly, to a multifunctional electronic apparatus.

2. Description of the Prior Art

Typically, electronic apparatuses are in general provided with various functions and features. To operate these electronic apparatuses, it is essential for users to have enough knowledge and ability to use such functions. There are a variety of users from the point of view of the user's knowledge and ability to use these functions.

Such tendency is remarkable in particular in the users of television receivers, VTR's and other consumer electronic apparatuses. In other words, some users have full knowledge of the operation of the apparatus while the majority of general users have but a little knowledge of that operation. For the general users, consumer electronic apparatuses as mentioned above have been difficult to use and therefore not comfortable to use.

In general, electronic apparatuses having various functions and advanced features have been hard to operate and not so comfortable to general users. For these reasons, malfunction often occurs because of incorrect use by the general users. Once malfunction occurs, the electronic apparatuses do not operate as intended by the users.

In addition, a user's manual for such electronic apparatuses is often a thick volume to explain the variety of functions available. The general users are hardly able to read such a detailed user's manual in order to understand the operation.

OBJECTS AND SUMMARY OF THE INVENTION

An object of the invention is, therefore, to provide an electronic apparatus permitting the effective use thereof in accordance with a level of each user's knowledge and ability.

According to an aspect of the present invention, there is provided an electronic apparatus having two or more functions comprising:

nonvolatile storage means in which the identities of two or more keys are stored;

function control means in which two or more functions are classified into groups, each group being distinguished by two or more of the keys; and control means which is coupled with the nonvolatile storage means and the function control means and enables a function that is selected by operating a key, which function matches an identification number to be entered by a user.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Hereunder, one embodiment of the invention will be described referring to FIGS. 1 to 3. In this embodiment, the invention is applied to a television receiver.

Figure 1:
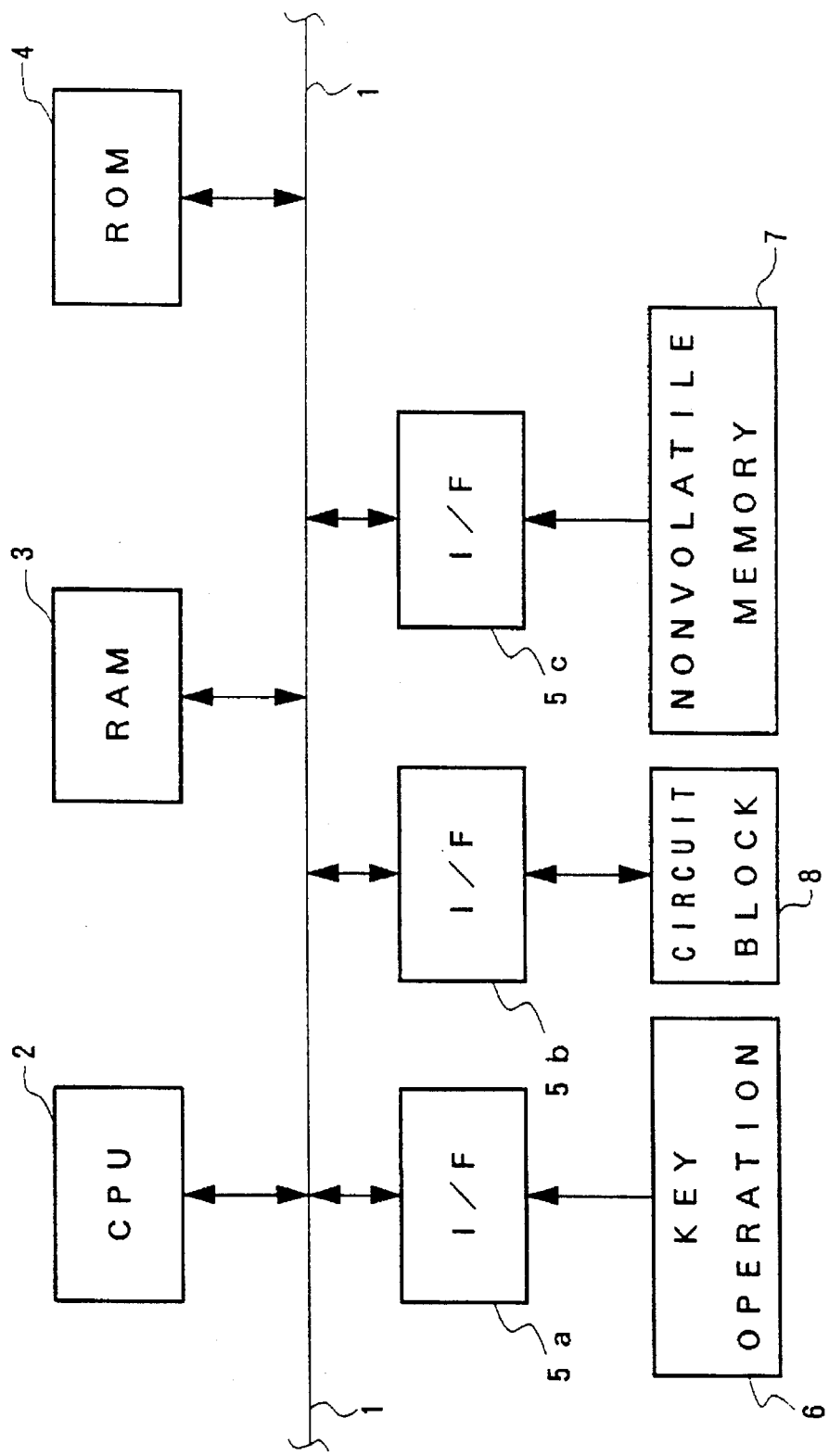
FIG. 1 is a block diagram describing one embodiment of an electronic apparatus according to the invention.

As shown in FIG. 1, bus 1 is connected with CPU 2, RAM 3, ROM 4, and interface blocks 5a, 5b, 5c, etc.

Interface block 5a is connected with key operation portion 6 having keys or push buttons, and interface block 5b is connected with circuit block 8 such as a BS tuner circuit, a DSP (Digital Signal Processor), a video processor, an audio processor and a multivoice block (though not specifically shown in the figure). Interface block 5c is connected with nonvolatile memory 7.

Nonvolatile memory 7 stores identification numbers for each of the functions or for each of two or more grouped functions. The identification numbers are individual to each apparatus, and not common between apparatuses. The identification numbers are stored in nonvolatile memory 7 at the time of shipment of the apparatus from the manufacturer.

The functions mentioned above include the following:

Concerning picture quality control... Hue, color density, brightness, sharpness, color temperature, notch filter, noise reduction, etc.

Concerning tone quality control . . . Balance between high-pitched and low-pitched tone, balance between the rear speakers of four speakers, surround sound (including Dolby Surround, Hall Surround, and Simulated Stereo), equalizing using DSP, etc.

Others . . . Booking, current time, channel blocking function, daylight saving, channel caption, etc.

It is possible to assign a different identification number to each function or each group of functions.

The operation will now be described hereunder with reference to FIGS. 2 and 3.

Figure 2:
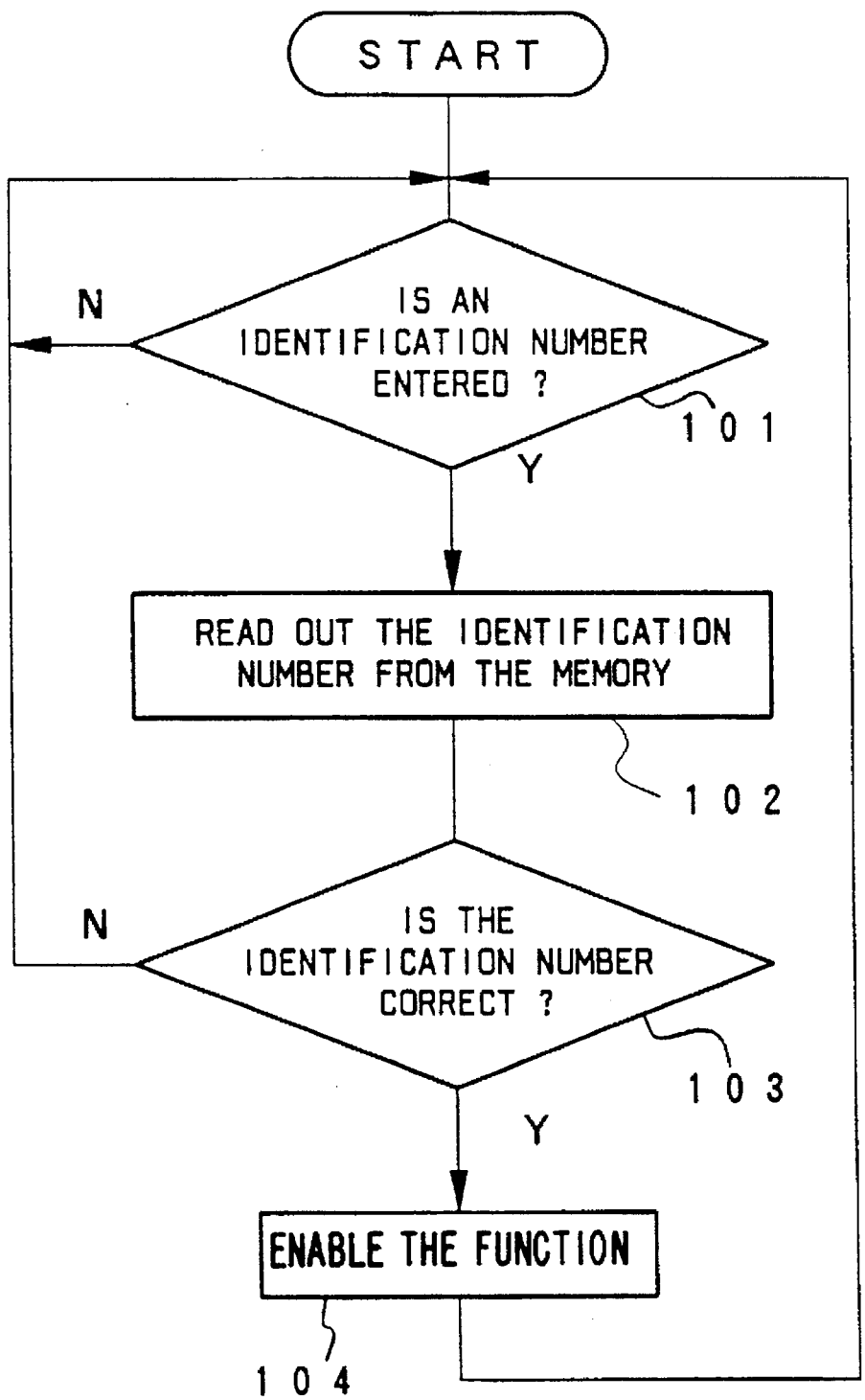
FIG. 2 is a flow chart concerning enabling disabled functions.

In the flow chart as shown in FIG. 2, in step 101, it is determined whether an identification number is entered by the user from key operation portion 6 into CPU 2 through interface block 5a.

If the identification number is not entered, the step returns to the start. If the identification number is entered, the operation goes to step 102.

In step 102, the identification numbers stored in nonvolatile memory 7 are read through interface block 5c and bus 1. Then, the operation goes to step 103.

In step 103, CPU 2 determines whether the entered identification number is the same as one of the identification numbers stored in nonvolatile memory 7. If the entered identification number does not match any one of the stored numbers, the operation returns to the start. If the entered identification number matches one of them, the operation goes to step 104.

In step 104, a function corresponding to the matched identification number is enabled and becomes available to the user. In step 104, at least data such as the matched identification number and functions corresponding to that number are under the control of the CPU 2.

In the embodiment, enabling the functions is initiated by entry and matching of the identification number, but not limited to this. For example, the functions can be enabled by simultaneously pushing two or more buttons provided in key operation portion 6, or by pushing them in a specified order.

For the other functions which remain disabled, CPU 2 controls a program of those functions to prevent them from running, or to prevent power supply to the circuit blocks performing the functions.

A user may sometimes enter a command to perform a particular function. In this case, it is necessary to confirm whether the particular function or a group of functions to which the particular function belongs is enabled or not. The procedure in this regard will be given below, with reference to FIG. 3.

Figure 3:
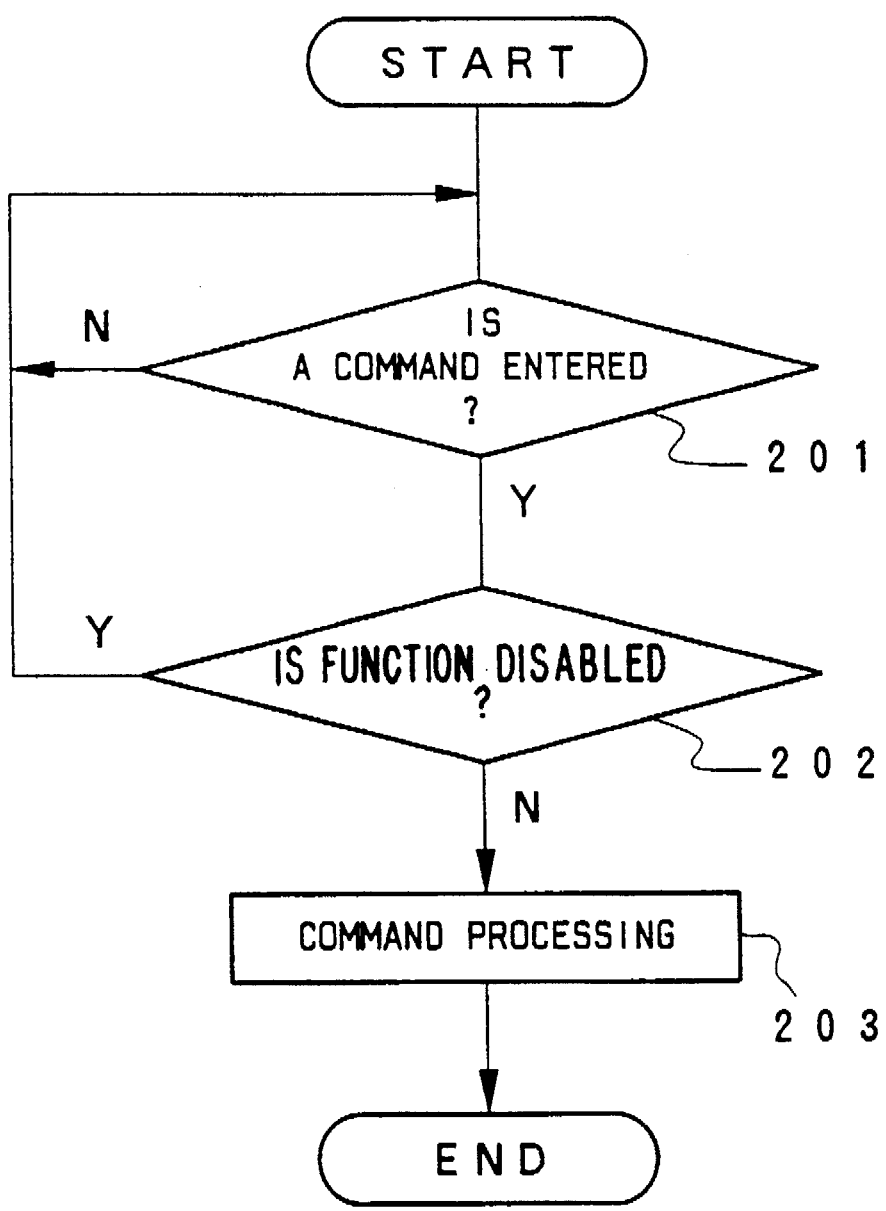
FIG. 3 is a flow chart of the processing order when a command is entered by user.

In step 201 in the flow chart shown in FIG. 3, CPU 2 determines whether a command is entered by the user or not. If a command is not entered in step 201, the operation returns to the start. If a command is entered, the operation goes to step 202.

In step 202, CPU 2 determines whether a particular function corresponding to the command or a group of functions including the particular function specified by the user is enabled or not. If the function remains disabled, the operation returns to the start. If the function is enabled, the operation goes to step 203.

In step 203, the command is executed so that the particular function is carried out. Then, the operation is terminated.

In the embodiment, an identification number is given to each function or each group of functions which are disabled. The disabled functions are not enabled until an identification number entered by the user from key operation portion 6 matches an identification number which is previously allotted to each of the disabled functions and stored in nonvolatile memory 7. In other words, if the entered identification number matches the stored identified number, then the disabled function corresponding to the matched identification number is enabled and becomes available to the user.

Therefore, it becomes possible for a user to operate an electronic apparatus with safety according to the user's level of knowledge and ability to use the apparatus. If the user attains a higher level of knowledge and ability of the operation, the user can use more functions after enabling those functions by entry of the corresponding identification numbers.

Thereby, it is possible to protect the user from wrong operation.

Furthermore, a user's manual associated with an electronic apparatus can be thin and simple with a minimum of information necessary to the general users so that such a simple manual becomes more acceptable to the general users. For users hoping to use advanced or varied functions, an advanced user's manual and identification numbers will be assigned to the advanced functions.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

For example, in the above embodiment, all the functions for a television receiver are provided in advance, and a function corresponding to an identification number becomes available once the identification number is entered by a user. However, the present invention is not limited to this. For example, a packaged circuit board prepared according to the levels of user's operation knowledge and ability, can be mounted in an apparatus and as a user's level in operation knowledge and ability increases, the functions of the apparatus are made more advanced and more varied.

What is claimed is:

1. An electronic apparatus operable to select a plurality of functions implemented in conjunction with a circuit block, comprising:

CPU means for controlling said functions, at least one of said functions initially being impermanently disabled by said CPU means by preventing at least one of an operation of a software program and a supply of power to said circuit block;

memory means for storing identification numbers assigned to said disabled functions, said identification numbers not being secret codes;

key code input means operable by a user for generating a key code;

an interface block coupled to said key code input means and to said CPU means; and wherein said CPU means further comprises function enabling means for comparing said key code generated by the user and said identification numbers stored in said memory means and for enabling a corresponding one of said impermanently disabled functions if said key code matches one of said identification numbers, whereby a particular combination of said impermanently disabled functions becomes available for selection and control by the user.

2. The electronic apparatus according to claim 1, wherein said impermanently disabled functions are classified into groups and a single identification number is assigned to each group of said impermanently disabled functions so that said impermanently disabled functions in a particular group are enabled upon entry of a single key code.

3. The electronic apparatus according to claim 1, wherein said key code input means comprises at least two push buttons for generating said key code when said push buttons are operated simultaneously by the user.

4. The electronic apparatus according to claim 1, wherein said key code input means comprises at least two push buttons for generating said key code when said push buttons are operated by the user in a specific order.

5. An electronic apparatus operable to select a plurality of functions, comprising:

function control means for controlling said functions, wherein said functions comprise at least a first group and a second group, at least said second group of functions initially being impermanently disabled;

memory means for storing identification numbers assigned to said impermanently disabled groups of functions;

key code input means operable by a user for generating a key code;

function enabling means for comparing said key code generated by the user and said identification numbers stored in said memory means and for enabling a corresponding one of said impermanently disabled groups of functions if said key code matches one of said identification numbers, whereby a particular combination of said impermanently disabled functions becomes available for selection and control by said user.

6. The electronic apparatus according to claim 5, wherein said key code input means comprises at least two push buttons for generating said key code when said push buttons are operated simultaneously by the user.

7. The electronic apparatus according to claim 5, wherein said key code input means comprises at least two push buttons for generating said key code when said push buttons are operated by the user in a specific order.

* * * * *